(12) United States Patent
Samaan

(10) Patent No.: US 6,677,783 B2
(45) Date of Patent: Jan. 13, 2004

(54) HIGH-SPEED, STATE-PRESERVING, RACE-REDUCING, WIDE-PULSED-CLOCK DOMINO DESIGN STYLE

(75) Inventor: Samie B. Samaan, Lake Oswego, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/039,640

(22) Filed: Dec. 31, 2001

(65) Prior Publication Data

US 2003/0122582 A1 Jul. 3, 2003

(51) Int. Cl.[7] .......................................... H03K 19/096
(52) U.S. Cl. ............................. 326/96; 326/95; 326/93; 326/97
(58) Field of Search ................................... 326/93–98

(56) References Cited

U.S. PATENT DOCUMENTS 5,453,708 A * 9/1995 Gupta et al. ................... 326/98
5,517,136 A * 5/1996 Harrise et al. ................. 326/93
5,825,208 A * 10/1998 Levey et al. ................... 326/98

* cited by examiner

Primary Examiner—Anh Tran
(74) Attorney, Agent, or Firm—Cynthia T. Faatz

(57) ABSTRACT

A high-speed, state-preserving, race-reducing, wide-pulsed clock domino design style. For one aspect, a pipestage in accordance with the wide-pulsed clock design style includes one or more domino logic stages and a wide-pulsed clock generator to provide a wide-pulsed clock signal to control evaluation of the one or more domino logic stages in response to receiving a two-phase input clock signal. The wide-pulsed clock signal has a pulse width that tracks a phase width of the input clock signal over a first frequency range where the first frequency range extends at least from a predetermined fraction of a nominal clock frequency to an upper frequency limit for the circuit. For one aspect, ratio logic is coupled to at least one of the domino stages. The wide-pulsed clock signal provides sufficient time for the one or more domino logic stages to evaluate while preventing infinite or very long contention in one or more ratio logic stages when the input clock signal is stopped or slowed down significantly.

24 Claims, 7 Drawing Sheets

HIGH-SPEED, STATE-PRESERVING, RACE-REDUCING, WIDE-PULSED-CLOCK DOMINO DESIGN STYLE

BACKGROUND

1. Field

An embodiment of the present invention relates to the field of high frequency integrated circuits and, more particularly, to high frequency integrated circuits that include domino and, in some cases, ratio or other power contention-susceptible logic.

2. Discussion of Related Art

Advances in semiconductor manufacturing technologies have enabled circuit designers to continue to integrate more transistors on a single die. At the same time, computer architecture, and more specifically, processor architecture, continues to focus on shorter and shorter cycle times.

Domino logic is frequently used to achieve high-speed operation and to reduce die area and output capacitance as compared to static complementary metal oxide semiconductor (CMOS) logic.

As clock speeds continue to increase (and thus, cycle times continue to decrease) and/or where certain parts of a chip operate at a much higher frequency, limitations of conventional logic circuits, including conventional domino logic circuits, may prevent such circuits from operating properly at the higher clock speeds.

Further, many conventional domino logic circuits operate using a two-phase clock. For very high operating frequencies, it may not be feasible to generate and distribute a two-phase clock due to noise, clock jitter and/or other issues. Hence, a higher frequency clock may be generated locally and such clocks tend to be pulsed clocks.

Ratio logic has been used in some cases as a high-speed and area-efficient way to realize logical NOR functions, for example. Use of ratio logic in this manner can eliminate the need for P device stacks that are both large and slow. Ratio logic can typically only be used in pulsed-clock domino circuits, however, due to the fact that indefinite or very long contention may be caused when a normal two-phase clock is stopped or slowed down to a very low speed.

Thus, for some current circuit designs, a narrowly pulsed clock is used to enable use of ratio logic and achieve high-speed operation. Where a narrowly pulsed clock is used instead of a conventional two-phase clock, logic may be more susceptible to functional errors due to race conditions making such circuits more difficult for design engineers to work with. Further, such circuits often push the limits of design tool capability, can limit timing design space and increase design time due to their complexity and narrow margins.

BRIEF DESCRIPTION OF THE DRAWINGS

The present invention is illustrated by way of example and not limitation in the figures of the accompanying drawings in which like references indicate similar elements, and in which.

DETAILED DESCRIPTION

Figure 1:
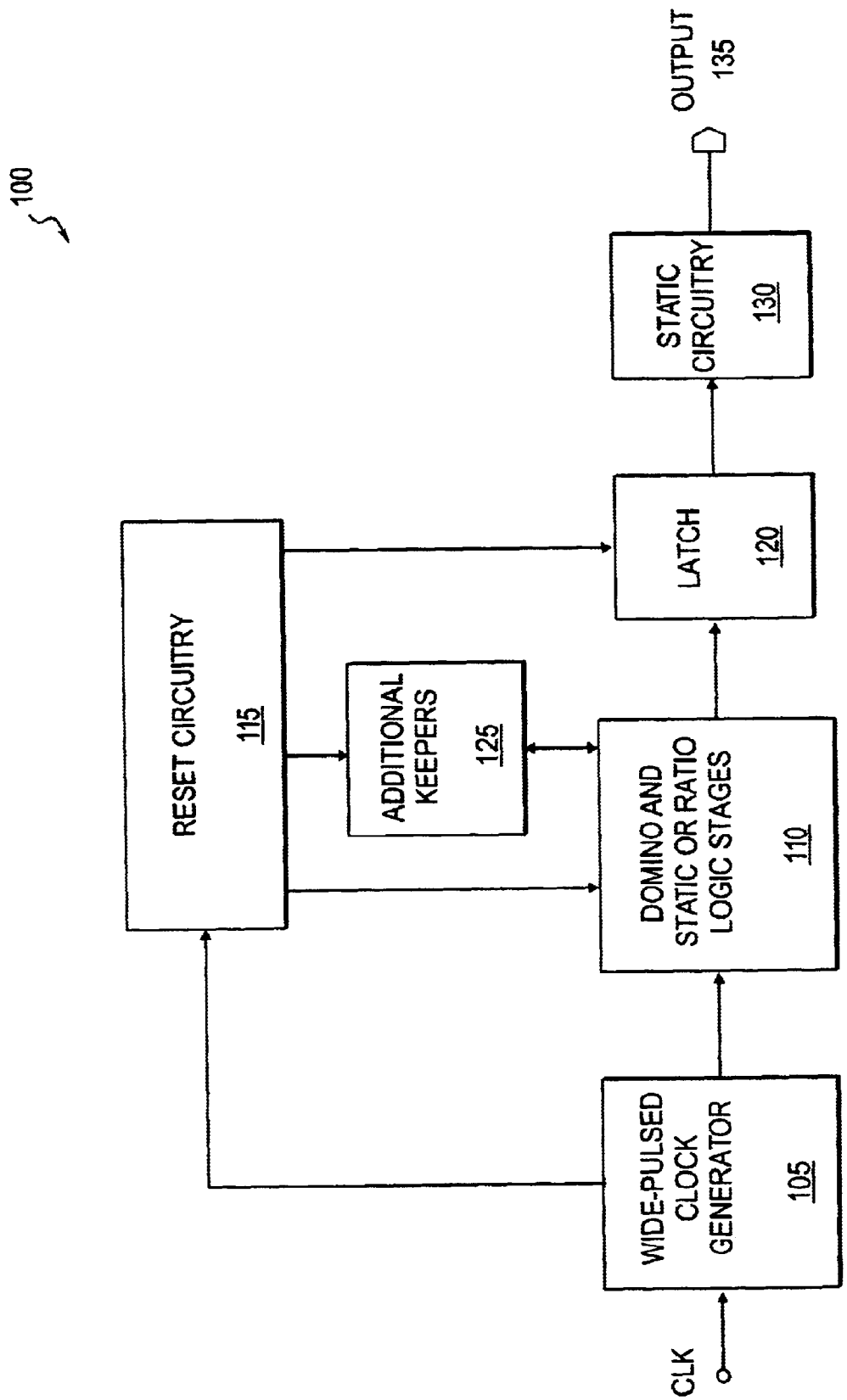
FIG. 1 is a block diagram of the high-speed, state-preserving, race-reducing, wide-pulsed clock domino topology of one embodiment.

A high-speed, state-preserving, race-reducing, wide-pulsed clock domino topology is described. In the following description, particular types of integrated circuits and circuit configurations are described for purposes of illustration. It will be appreciated, however, that other embodiments are applicable to other types of integrated circuits and to integrated circuits configured in another manner.

For one embodiment, a circuit includes one or more domino logic stages and a wide-pulsed clock generator to provide a wide-pulsed clock signal to control evaluation of the one or more domino logic stages in response to receiving a two-phase input clock signal. The wide-pulsed clock signal of one embodiment has a pulse width that tracks a phase width of the input clock signal over a first frequency range where the first frequency range extends at least from a predetermined fraction of a nominal clock frequency to an upper frequency limit for the circuit. For one embodiment, the upper frequency limit is the highest frequency at which the devices on the host integrated circuit (IC) are expected to operate properly (i.e. the frequency limit for the technology used to produce the host IC). For another embodiment, the upper frequency limit may be lower and may represent, for example, the highest frequency at which the host integrated circuit is intended to operate.

"Pulse-to-phase width tracking" as the term is used herein refers to the fact that as the phase width of the input clock signal increases, the pulse width of the wide-pulsed clock signal increases and as the phase width of the input clock signal decreases, the pulse width of the wide-pulsed clock signal decreases over the specified frequency range. Pulse-to-phase width tracking, however, does not necessarily mean that the pulse width of the wide-pulsed clock signal is equal to the phase width of the input clock signal as will be described in more detail below.

Using the wide-pulsed clock design style of one embodiment, it may be possible to design high-speed circuits with fewer race condition-related issues than their conventional counterparts while also preventing infinite or very long contention in ratio logic and/or other power contention-susceptible logic where it is used. "Very long" contention as the term is used herein refers to contention that lasts a few or more multiples of the width of a phase of the input clock signal at a nominal frequency. Also, while ratio logic is referred to in some of the exemplary embodiments described below, it will be appreciated that other types of power contention-susceptible logic families may be used interchangeably. Additional details of this and other embodiments are provided in the description that follows.

The circuit topology of various embodiments may be particularly useful for the most speed-critical areas of an integrated circuit. For example, in a microprocessor, execution unit-related circuitry such as adders, bypass circuitry, fast shifters, schedulers, etc. may fall into this category. Other types of circuitry may also benefit from the design style of various embodiments.

FIG. 1 is a high-level block diagram of a pipestage 100 in accordance with the wide-pulsed clock design style of one embodiment. The pipestage 100 includes a wide-pulsed clock generator 105, domino and static or ratio logic stages 110, reset circuitry 115, a latch 120, and additional keepers 125 for the intermediate domino stages 110. The latch 120 provides a static data output signal to static circuitry 130, which may include multiple static logic stages, for example, and may additionally or alternately include interface circuitry to interface the pipestage 100 to subsequent circuitry (not shown) at an output node 135. The configuration and operation of each of the referenced logic blocks is described in more detail below.

Figure 2:
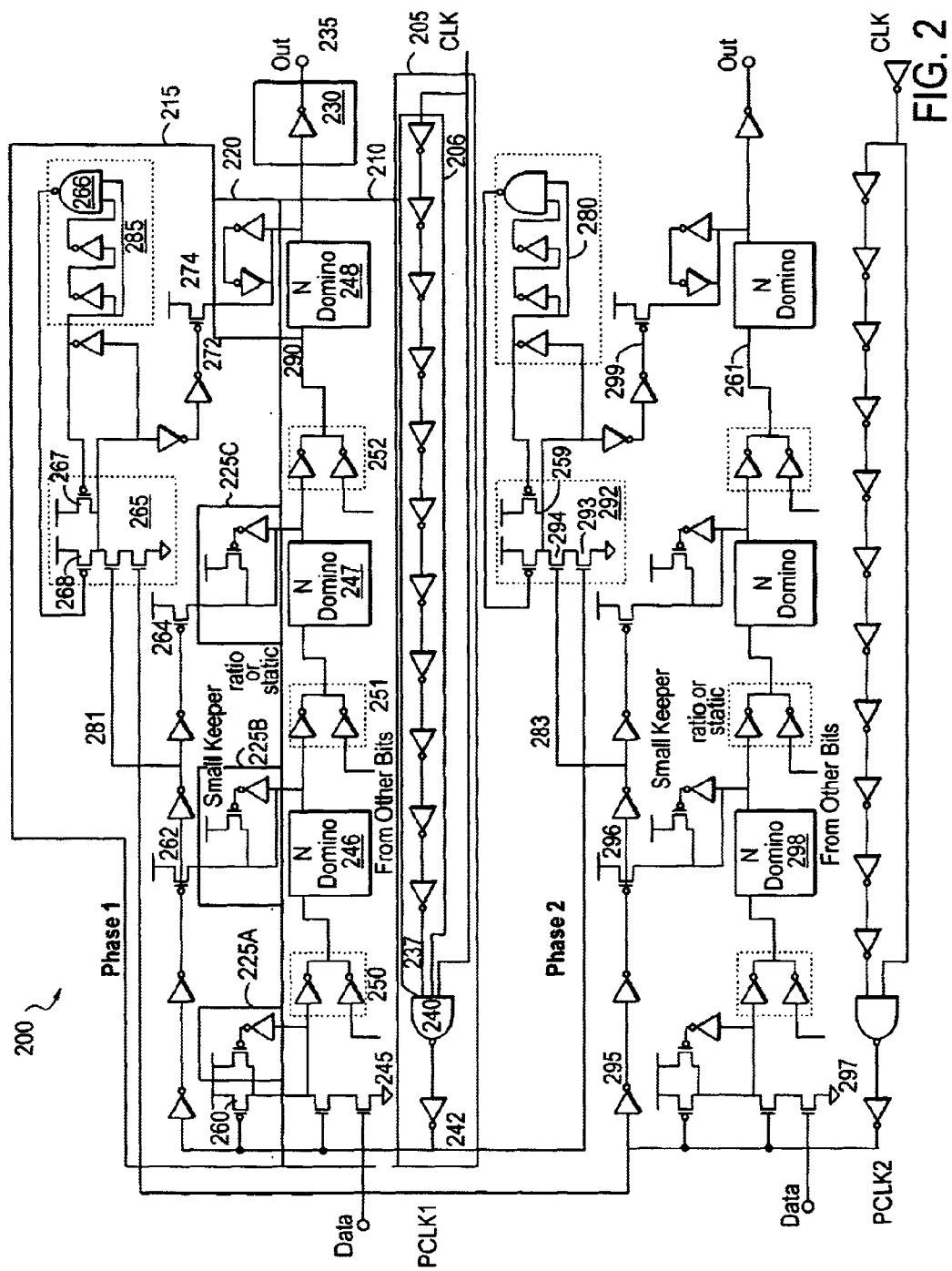
FIG. 2 is a schematic showing an exemplary pipestage in accordance with the topology of FIG. 1.

FIG. 2 is a schematic diagram of the two possible phases of an exemplary pipestage 200 to illustrate the wide-pulsed circuit topology of one embodiment in more detail. The pipestage 200 may be included in a high-frequency microprocessor, for example, or in another type of circuit that operates at a relatively high frequency.

The phases of the pipestage 200 are referred to as Phase 1 and Phase 2 as shown and correspond to respective phases of an input clock signal CLK. While the configuration and operation of Phase 1 of the pipestage 200 are described herein, it will be appreciated that the configuration and operation of Phase 2 of the pipestage 200 are similar, except that a complementary form of the input clock signal CLK is provided to the wide-pulsed clock generator of Phase 2. Additional differences may be noted in the description where applicable.

Further, the pipestage 200 is for a single bitslice. It will be appreciated that pipestages corresponding to other bitslices may be configured in a similar manner.

Phase 1 of the pipestage 200 of one embodiment includes a wide-pulsed clock generator 205 to provide a wide-pulsed clock signal, domino and static and/or ratio logic stages 210 to implement the logic of the pipestage 200, reset circuitry 215 to control resetting (precharging) of each of the domino stages between evaluation states, a latch 220 to preserve the state of the output of the final domino stage, and static circuitry 230, in this case an inverter, to interface the pipestage 200 with subsequent logic (not shown). An output of Phase 1 of the pipestage 200 is provided at an output node 235.

The wide-pulsed clock generator 205 of one embodiment is a chopper including a large number of inversions in the inverting delay path 206 to provide a relatively long delay path. "Relatively long" as the term is used herein in reference to the delay path refers to a delay that is comparable to the phase width of the nominal input clock signal or longer for at least one signal transition direction. For one embodiment, for example, the relatively long delay path could be anywhere from 1 inversion less than the nominal input clock phase width to a delay equal to or larger than the nominal phase width.

For one embodiment, 11 inverters are included in the inverting delay path 206 as shown, however, a different number of inverters may be used for other embodiments. A NAND gate 240 has one input coupled to the inverting delay path 206 including the 11 inverters and another input coupled to receive the CLK signal. An output of the NAND gate 240 is coupled through an inverter 242 to provide a wide-pulsed output clock signal pclk1.

As mentioned above, the wide-pulsed clock signal pclk1 provided by the clock generator 205 has a pulse width that tracks a phase width of an input clock signal CLK over a relatively broad frequency range. To achieve such pulse-to-phase width tracking, particular design considerations are taken into account.

For the embodiment shown in FIG. 2, for example, the device sizes in the inverting delay path 206 of the wide-pulsed clock generator may be selected such that the delay through the inverting delay path 206 for a low to high transition of the CLK signal (i.e. leading edge) is nominally equivalent to 11 inversions of delay. Inversion, as the term is used herein, refers to a unit of delay approximately equal to the delay through a standard inverter at nominal operating speeds.

Assuming, for purposes of example, a nominal phase for a 50% duty cycle input clock signal CLK is equal to 8 inversions, the 11-inversion delay of the inverting delay path 206 is about 1.4 times the width of a CLK phase. Using these values, as the frequency of the input clock signal CLK drops to about 70% of the nominal design value, pulse limiting sets in (i.e. an output 237 of the last inverter in the inverting delay path goes low), and an upper limit on the pulse width of the output pulsed clock pclk1 is reached.

While the upper limit on the pulse width of pclk1 is reached at an input clock signal frequency that is about 70% of nominal for this example, it will be appreciated that the clock generator 205 may be designed such that this upper limit is reached at a different point. The upper limit on the pulse width may be selected to be any point at which the pulse width is such that ample time is provided for evaluation of the domino logic stages of the pipestage 200.

Continuing with the above example, at medium and high frequencies for the input clock signal CLK that are above about 1.4 times the nominal design value, for the given phase width and inverting path delay for a low-going CLK signal transition, the input clock signal CLK itself causes the NAND gate 240 to be turned off to limit the width of the wide-pulsed output clock signal to be equal to that of a nominal clock phase as described in more detail below. In this case, however, the NAND gate 240 must be re-enabled just before the input clock signal CLK rises again.

For the embodiment of the wide-pulsed clock generator 205 shown in FIG. 2, this is achieved by the design of the wide-pulsed clock generator 205. In particular, the delay from the CLK signal going low to the signal at node 237 going high (i.e. the trailing edge) through the 11 inversions of the inverting delay path 206 (referred to herein as the re-enabling transition), is chosen for the above example such that it is roughly equivalent to only 4.5 inversions of nominal gate delay. This is accomplished in this example by sizing the devices responsible for communicating this transition to be 2.5 times faster than the devices that communicate the opposite transition.

Figure 5:
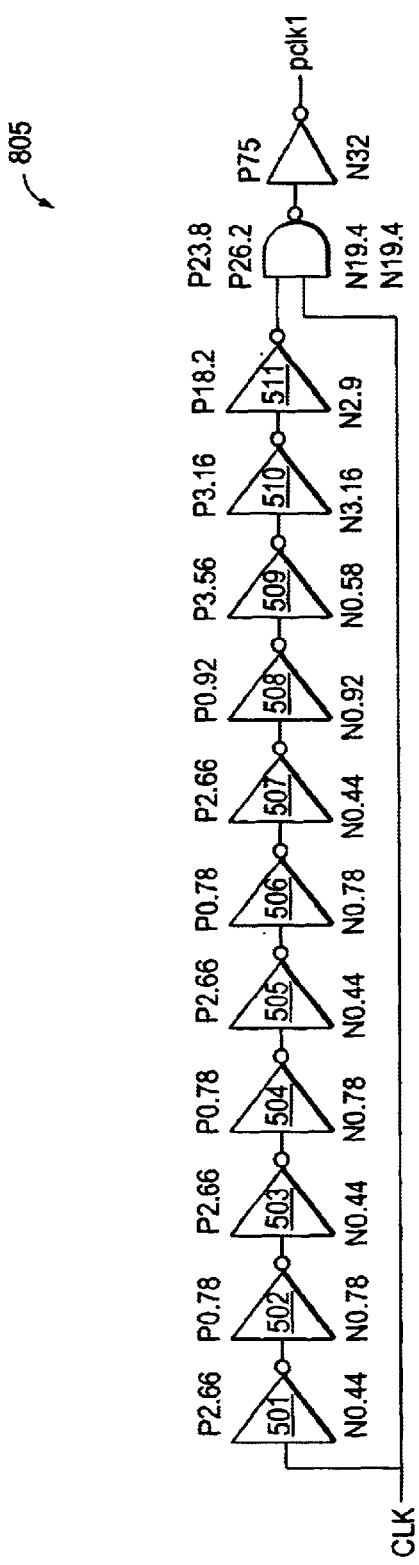
FIG. 5 is a schematic diagram showing the relative sizes of inverters for one embodiment in the wide-pulsed clock generator of FIG. 2.

For this specific example then, referring to FIG. 5, assuming a P-device to N-device process strength ratio of approximately 1:2.5, the P devices' widths are set equal to the widths of the N devices for even numbered inversions in the inverting delay path (i.e. inverters 502, 504, 506, 508 and 510). For odd numbered inversions (i.e. inverters 501, 503, 505, 507, 509 and 511), the widths of the P-devices are selected to be 6.3 times the widths of the associated N-devices.

It will be appreciated that for different frequencies and/or different P-device to N-device strength ratios, for example, the relative delays through the inverting delay paths may be different to achieve a similar result and/or the P-device to N-device width relationships may be different.

In addition to the above-described sizing considerations, in order to ensure that the NAND gate 240 is re-enabled (i.e. input 237 goes high) before the next cycle, the wide-pulsed clock generator 205 is designed to exhibit the property of pulse evaporation to ensure that the pulse-to-phase width tracking of the pclk signal continues at high frequencies. Pulses evaporate when an input pulse to a static gate has a width that is comparable to the rise plus fall times of the gate. In long chains of inversions, even wide pulses evaporate when the cumulative delay of the leading edge of the pulse, from the input to the output of the delay chain, is larger than the cumulative delay of the trailing edge of the pulse by an amount comparable to the input pulse width.

For the above-described example, the criterion for evaporation sets in as frequency increases. Because the leading edge delay for the CLK signal is much longer than the trailing edge delay by design, the trailing edge of the CLK signal arrives at the node 237 before the leading edge for certain CLK signal frequencies above the nominal frequency. In this manner, the node 237 remains high such that the NAND gate 240 remains enabled and acts as a simple inverter passing normal clock transitions as they occur at high speed. Thus, the wide-pulsed clock generator 205 of one embodiment may provide for phase width tracking up to the operational limits of the device technology used to implement the clock generator or the host integrated circuit on which it is included.

For one embodiment, even intra-die device delay variation, which may cause a change of about ±30% in a small gate's delay, does not negate the functionality described above for a number of reasons. For one embodiment, the last two inverters and the P-devices in the odd-numbered inverters of the inverting delay path 206 are designed to be mid-sized relative to other devices in the integrated circuit that includes the clock generator 205. Large or mid-sized devices exhibit less random variations than smaller devices due to their larger channel area. Exemplary relative gate sizes for the devices in the inverters of the clock generator 205 are shown in FIG. 5 for purposes of example. It will be appreciated that other transistor gate sizes and relative sizes are within the scope of various embodiments.

Further, a large portion of intra-die variation is random (i.e. distance-independent). Long delay chains, such as the delay chain in the wide-pulsed clock generator 205, attenuate random variation statistically by the square root of the number of inversions in the delay chain.

The remaining part of intra-die variation is distance-dependent, whereby device mismatch increases as devices are spatially separated. The relevant distances for current process technologies for designs such as the clock generator 205 are on the order of hundreds of microns. Since all devices in the inverting delay path 206 are in close proximity to each other, and the rise and fall transitions of the signal at the node 237 use both N and P devices, the distance-correlated part of the intra-die variation does not significantly affect the ability of the clock generator 205 to continue to provide output pulse-to-input phase width tracking even at higher frequencies.

Figure 6:
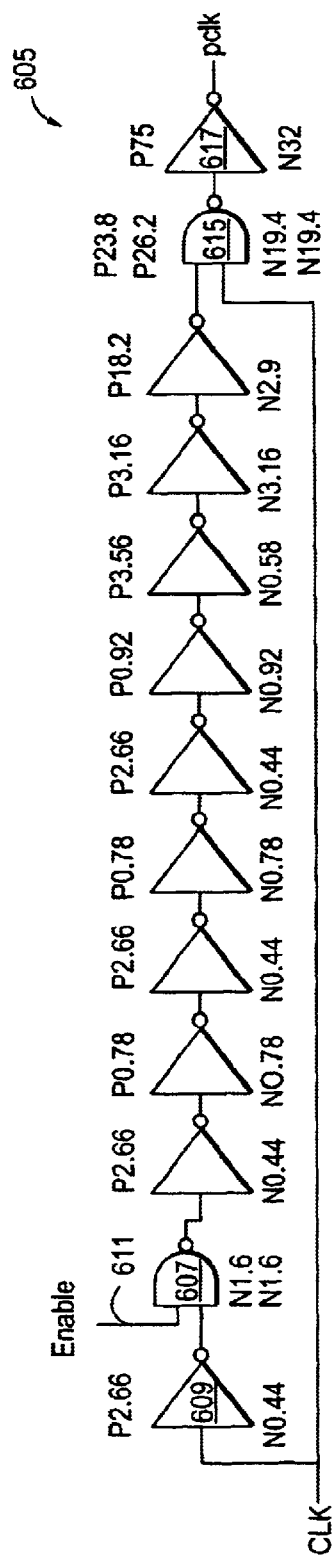
FIG. 6 is a schematic diagram of a wide-pulsed clock generator of another embodiment.

FIG. 6 shows a wide-pulsed clock generator 605 of another embodiment that may be used, for example, in place of the wide-pulsed clock generator 205 and/or the similar wide-pulsed clock generator for the phase 2 portion of the pipestage 200. The wide-pulsed clock generator 605 provides for clock gating. Clock gating is a well-known power saving technique by which a clock signal driving a pipestage can be turned off for one or more cycles during operation of the host chip when that pipestage is not needed to perform any function.

For the wide-pulsed clock generator 605, to enable clock gating, a NAND gate 607 is provided in place of the second inverter in the inverting delay path. One input of the NAND gate receives the output of the first inverter 609 in the inverting delay path while the second input of the NAND gate 607 receives an enable control signal at an enable control input 611.

When the enable control signal is high, the chopper 605 operates in a similar manner to the chopper 205 described above. When the enable control signal is low, however, all subsequent inverters in the inverting delay path (i.e. all inverters except the first inverter 609), the NAND gate 607, the output NAND gate 615 and the output buffer 617 are prevented from toggling with the input clock signal CLK. In this manner, power savings may be realized when circuitry coupled to an output of the clock generator 605 is not in use.

For implementations for which the input clock signal CLK has a 16-inversion cycle time, for the embodiment shown in FIG. 6, the wide-pulsed clock generator 605 is disabled within approximately 10 inversions. For significantly higher clock frequencies, it may be desirable to disable the wide-pulsed clock generator with less delay. For such embodiments, this may be accomplished by locating the enable control NAND gate 607 later in the inverting delay path (e.g. $4^{th}$, $6^{th}$, or any later, even inversion). It will be appreciated, however, that locating the enable control NAND gate 607 further down the inverting delay path may reduce the power savings within the chopper itself as compared to the exemplary embodiment shown in FIG. 6 by reducing the number of devices that are prevented from toggling and increasing some device sizes.

The wide-pulsed clock generators of various embodiments have several advantageous properties. For purposes of illustration, many of these properties are described using a specific example in which the width of each phase of the input clock signal CLK is approximately equivalent to 8 inversions.

First, the large number of gates in the long inverting delay path provides a wide-pulsed clock signal pclk1 that helps to reduce or eliminate race conditions as described in more detail below. The configuration of the described wide-pulsed clock generator is such that the pclk1 pulse becomes wider to track any slowing of the input CLK frequency, even well below the nominal frequency. For one embodiment, the wide-pulsed clock generator may provide such tracking even for CLK frequencies as low as approximately 70% of nominal. As such, use of the wide-pulsed clock generator may facilitate set-up time improvement during silicon debugging, for example.

Secondly, as the frequency of the input clock signal CLK increases, the wide-pulsed clock generator of various embodiments operates such that the pulse width for the wide-pulsed clock pclk1 only shrinks to be approximately equivalent to the width of a phase of the input clock signal CLK (plus or minus variations due to design error, etc.).

By making the leading edge delay larger than the trailing edge delay (2.5 times larger for the exemplary embodiment described above), as described above, the wide-pulsed clock generator of one embodiment is capable of preserving pulse-to-phase width tracking even when the frequency of the input clock signal CLK is increased significantly over the nominal clock frequency. For one embodiment, the wide-pulsed clock generator is capable of preserving pulse-to-phase width tracking for frequencies of the CLK signal that are as much as about 75% higher than the nominal frequency. In fact, evaporation of the low-going transition at the final node in the inverting delay path (e.g. node 237 for the wide-pulsed clock generator 205) may enable even larger frequency increases, up to the operational limits of the device technology for some embodiments, while maintaining pulse-to-phase width tracking.

Further, while the input clock signal CLK may typically have a 50% duty cycle, the wide-pulsed clock generator of some embodiments (and, the entire pipestage 200, as described in more detail below) is also capable of operating with input clock signals that have phases that represent something other than a 50% duty cycle. This is because the chopper of the wide-pulsed clock generator essentially reduces to two inverting delay stages. Where such input clock signals are used, the wide-pulsed clock generator enables interfacing the per-phase output of the pipestage 200 to pipestages clocked by the non-50% duty cycle CLK signal in a relatively straightforward manner.

Referring back to FIG. 2, the remainder of the pipestage 200 is described in more detail. The domino and static and/or ratio logic stages 210 of the exemplary pipestage 200 of one embodiment include domino stages 245–248 and static and/or ratio logic stages 250–252. For one embodiment, the stages 250–252 are each ratio logic stages, which may be implemented in accordance with U.S. Pat. No. 5,942,917 to Chappell et al. entitled, "High Speed Ratioed CMOS Logic Structures for a Pulsed Input Environment," issued Aug. 24, 1999 and assigned to the assignee of the present invention. For other embodiments, one or more of the stages 250–252 may be implemented using static logic, a different type of ratio logic and/or a different type of power contention-susceptible logic that may be subject to infinite contention. Further, while each of the stages 250–252 includes inverters, other logical functions including complex logical functions, may be implemented in one or more of the stages 250–252.

Similarly, the domino stages 245–248 may implement any logical function desired. While four domino stages and three static and/or ratio logic stages 250–252 are shown in the pipestage 200, it will be appreciated that a different number of domino stages and/or static or ratio logic stages may be included in pipestages of other embodiments. For other embodiments, instead of the n-domino implementation shown in FIG. 2, p-domino logic may be used with complementary logic. For still other embodiments, zipper-type logic (alternating n-type and p-type domino stages) may be used.

The reset circuitry 215 of one embodiment includes a self-resetting precharge domino stage 265, an atomic reset circuit 285 and various inverters and precharge devices as described in more detail below.

The latch 220 of one embodiment is a jam latch as shown in FIG. 2. For other embodiments, a different type of latch may be used to latch the output of the final domino stage 248 for use by downstream logic.

The additional keepers 225 include keepers 225A–225C coupled to domino stages 245–247, respectively. The keepers 225A–225C are small half-keepers, for one embodiment, but may be implemented differently for other embodiments. Further, for embodiments including a different number of domino stages, a different number of keepers 225 may also be included.

The static circuitry 230 for the embodiment shown in FIG. 2 includes a single interface inverter. For other embodiments, however, additional static circuitry may be included between the pipestage 200 and subsequent circuitry (not shown) that is coupled to received the output signal 235.

Figure 3:
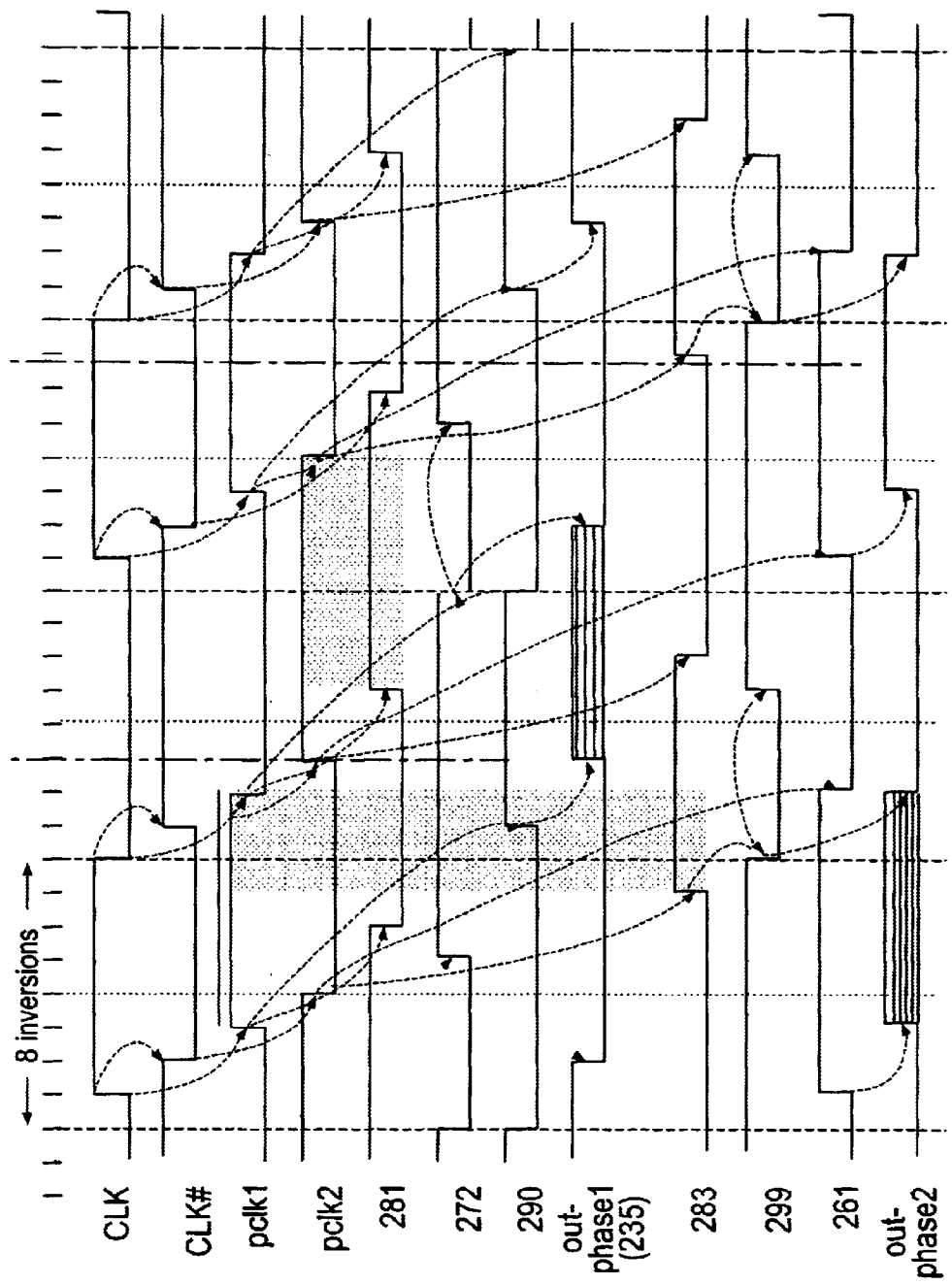
FIG. 3 is a timing diagram showing the operation of the pipestage of FIG. 2 for an exemplary higher input clock frequency.
Figure 4:
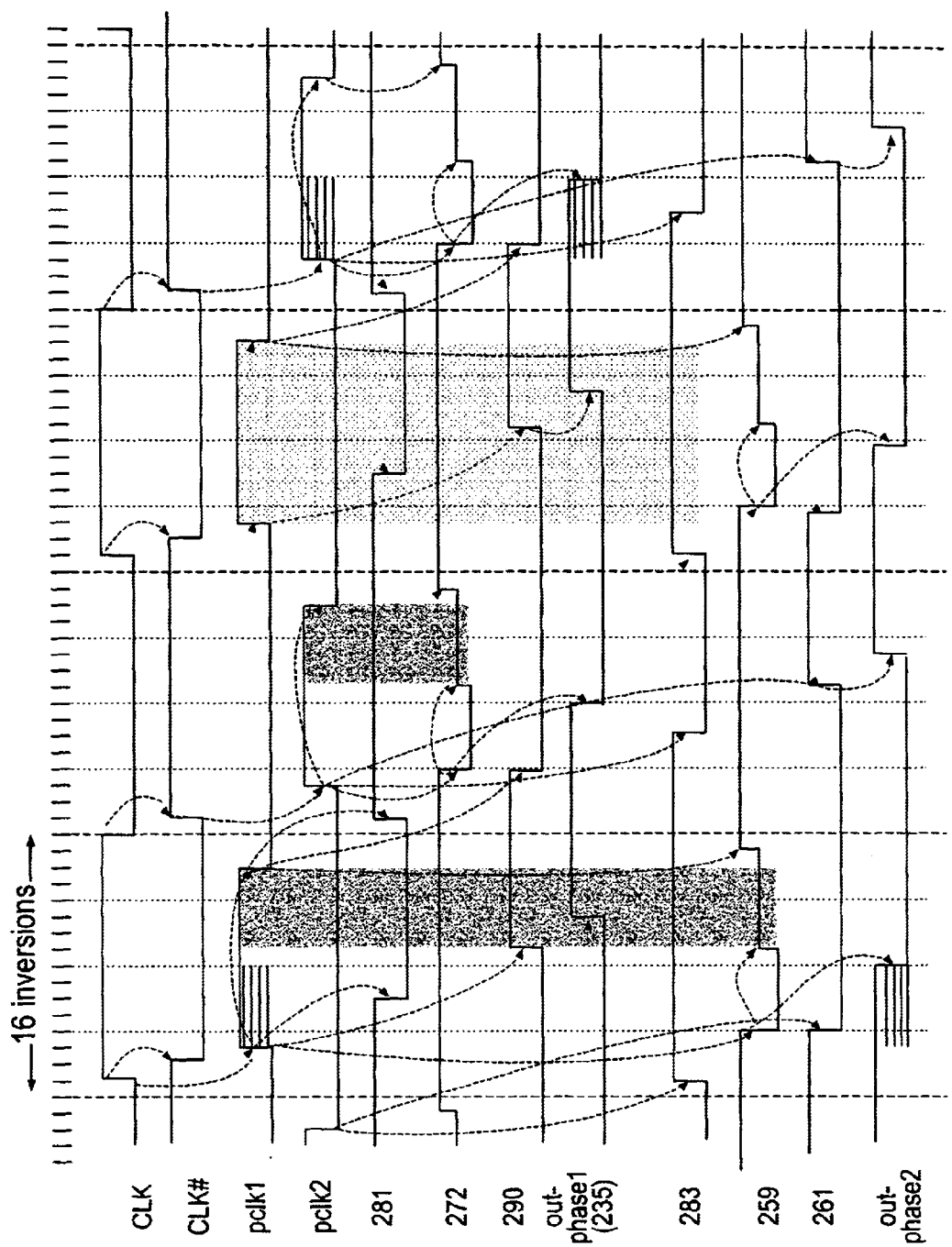
FIG. 4 is a timing diagram showing the operation of the pipestage of FIG. 2 for an exemplary lower input clock frequency.

FIGS. 3 and 4 provide exemplary timing diagrams showing some of the input, output and internal signals of both phases of the pipestage 200. While input clock signals having a 50% duty cycle may easily be used for one embodiment, in order to demonstrate the capabilities of the design style, the input clock signals CLK of FIGS. 3 and 4 have different duty cycles for which one or more of the race conditions associated with the pipestage 200 may be more difficult to meet. In particular, FIG. 3 shows such signals for an exemplary higher frequency input clock signal for which the cycle time is equivalent to approximately 16 inversions while FIG. 4 shows such signals for an exemplary lower frequency input clock signal for which the cycle time is equivalent to approximately 32 inversions. Other cycle times are within the scope of various embodiments.

Referring to FIGS. 2, 3 and 4, in operation, in response to the input clock signal CLK, the wide-pulsed clock generator 205 produces a wide-pulsed clock signal pclk1 as described above. In response to a rising edge of the CLK signal, a transition of the pclk1 signal from low to high causes the domino stage 245 to be enabled to sample the input data received at the node 255. For this embodiment, input data is received from a preceding stage (not shown) that evaluated on the opposite phase of the input clock signal CLK in order to prevent input data race-through (a hold low violation).

Thus, for one embodiment, use of the wide-pulsed pclk1 signal eliminates the input generation race condition, that is, it provides ample pulse width at the input stage, and leaves only the data hold high race condition that requires input data to be held long enough for the domino stage 245 to evaluate. If the preceding stage (not shown) is made of static latches opening on the alternate clock phase, however, then there is not a data hold high race condition either.

Stages 250, 246, 251, 247, 252, 248 and 230 domino-evaluate and remain in evaluation until the falling edge of the wide-pulsed clock signal pclk1 arrives at an input to the reset circuitry 215. The falling edge of the pclk1 signal causes a precharge device 260 to be enabled to initiate precharging of the domino stage 245. Two inversions after the falling edge of the pclk1 signal is received at the gate of the precharge device 260, a low signal is received at a gate of a precharge device 262 and two inversions after that, at a gate of a precharge device 264 such that precharging is subsequently initiated at domino stages 246 and 247.

Domino stage 248, however, is held in an evaluation state, thus preserving state at the latch 220. For lower frequencies, as shown in FIG. 4, the falling edge of the pclk1 signal simply causes the precharge NAND gate 265 to be "armed" such that it is ready to be enabled upon arrival of a rising edge of the pclk2 signal. In response to the rising edge of the pclk2 signal arriving at the NAND gate 265, the NAND gate 265 evaluates and, two inversions later, precharging of the domino stage 248 is initiated.

For higher frequencies, as shown in FIGS. 2 and 3, the pclk2 signal arrives at the NAND gate 265 first, and then, in response to a falling edge of the pclk1 signal, the signal line 281 goes high to cause the NAND gate 265 to evaluate. Precharging of the domino stage 248 is then initiated approximately two inversions later.

For both of these examples, the precharge pulse at the node 272 is terminated after about five inversions due to the operation of the atomic reset loop 285 as described in more detail below.

It will be appreciated that, in providing the reset pulse in the above-described manner, the domino NAND gate 265 acts as a pulse regeneration/restoration stage for the signal received at node 281.

Where ratio logic is used to implement one or more of the stages 250–252, it may be noted that, at high speed where the pulse width is essentially the same as the phase width of the input clock signal, contention in the ratio logic stage(s) lasts for one clock phase or about 50% of the cycle time for the exemplary embodiments described above. This is less than for some known double-pumped circuits where contention lasts for more than 60% of every phase of the clock. As CLK frequency is decreased to where a normal clock phase is wider than a pulse of the wide-pulsed clocks pclk1 and pclk2, the duration of contention as a percentage of cycle time also drops.

Using the wide-pulsed circuit topology of one embodiment, it may be possible to reduce or eliminate race conditions as compared to other high-speed circuit implementations. For one embodiment, there are six race conditions associated with internal reset and external output operations as follows. "Race condition" refers to the operation of a circuit in which the result, in terms of functionality or power consumption, is dependent on the amount of relative delay between two or more logical paths, as measured from a common triggering event, such as a clock edge, experienced by signals as they propagate through the circuit. Race conditions affect functionality and are frequency independent (i.e. if a race condition is not met, the circuit does not work at any frequency).

As described above, the final domino stage 248 is reset in response to the rise of the next clock phase pulsed clock for some frequencies or the falling edge of the pulsed clock that initiated the evaluation for other frequencies. The output hold high race condition requires that the output 235 of the pipestage 200 must be held long enough after the arrival of the second pulse in order to ensure the evaluation of the next pipestage.

For the exemplary embodiment shown in FIGS. 2 and 4, for example, this hold high minimum delay race condition is nominally 5 inversions long at low speed as indicated by the striped shading in FIG. 4 such that this race condition is relatively easy to meet. Further, 4 of the 5 transitions could be slowed down through design adjustments to make it even easier to meet. At higher speeds, as shown in FIG. 3, the margin for this race condition actually improves. At high speed, the NAND gates 265 of phase 1 and corresponding NAND gate 292 of phase 2 are triggered by the rising edges of signals at the nodes 281 and 283, respectively. For the higher frequency operation shown in FIG. 3, the signals at nodes 281 and 283 actually arrive 3 inversions later than the respective next pulsed-clock pulse as indicated by the shading in FIG. 3.

Another race condition is referred to herein as the domino stage 248 reset race and requires that the domino stage 248 must be reset before the next evaluate pulse is received. The self-resetting pre-charge domino stage 265 for the exemplary embodiment shown in FIG. 2 provides a 5-inversion precharge pulse to the precharge transistor 274. This race is also relatively easy to meet by making the precharge device 274 fast or the reset pulse wide enough. At lower clock frequencies as shown in FIG. 4, for example, this race is improved because the self-resetting pre-charge domino stage 265 remains in evaluation despite contention (see crosshatched area in FIG. 4) since the two inputs to this domino stage are still high while the atomic pre-charge loop 285 times out and the precharge device 268 starts pulling up.

To prevent termination of precharge before precharge has been completed, the precharge device 268 in the self-resetting precharge domino stage 265 could be made about 40–50% weaker than the effective N pull down stage and the self-termination keeper driver 287 could be skewed high. The contention in the domino stage 265 lasts for at most 5 inversions in this example which is comparable to the contention in the ratio logic elsewhere in the pipestage where it is used. This contention is also depreciated over a full clock cycle and can be made to meet hot electron degradation requirements.

Other race conditions associated with the pipestage 200 include domino stages 246 and 247 trail gap reset power races. The domino stages 246 and 247 trail gap reset power races require that the output of the respective preceding static or ratio logic stage must fall before the associated reset pulse arrives at the corresponding precharge gate in order to avoid contention. When the falling edge of the pclk1 signal arrives at the precharge device 260, it causes the domino stage 245 to be reset without a race. The output of the stage 250 must fall, however, before the reset pulse arrives at the reset device 262 for domino stage 246. The common point of this race condition is pclk1. This race is two inversions long for each leg and is relatively easy to meet or can even be violated slightly.

Similarly, for domino stage 247, the output of stage 251 must fall before the reset pulse arrives at the reset device 264. The common point of this race condition is the signal at the gate of the precharge device 262 and is also relatively easy to meet since it is also two inversions for each leg.

The pipestage 200 also has associated domino stage 246 and 247 lead gap end-of-reset power race conditions. Domino stage 246 and 247 lead gap end-of-reset power races require that the reset pulse at the respective precharge gates of each of the domino stages 246 and 247 must end (i.e. rise in this example) before the evaluation signal from the preceding static or ratio logic stage arrives at the input to the domino stage in order to avoid contention.

More specifically, after reset, when a new pclk1 rising edge arrives, the reset signal at the gate of the precharge device 262 must rise to end the reset pulse before the evaluation from static or ratio logic stage 250 arrives at an input to the domino stage 246. This is a power contention race condition with a common point of pclk1 and is relative easy to meet for the exemplary embodiment of FIG. 2, because it is two inversions long for each leg.

Similarly, for domino stage 247, the signal at the gate of the precharge device 264 must rise to end reset before the evaluation from the preceding stage 251 arrives at the input(s) to the domino stage 247. This is also a power contention race condition, but it is four inversions long for each of leg with a common point that is nominally at pclk1.

In reality, the second race (associated with domino stage 247) is a function of the first race (associated with domino stage 246) due to the linkage through the rise of domino stage 246. Both of these races are common in two-phase domino circuits. They may be violated with some impunity, but in order to remove any obstacles that might prevent a fast evaluation through the domino chain, the rising edges of the signals received at precharge devices 262 and 264 could be made to arrive early enough, such that there is ample margin in these two races.

Thus, each of the above-described race conditions is relatively easy to meet using the exemplary wide-pulsed clock design style of some embodiments.

In addition to the above-described race conditions, there are three internal speed paths associated with the exemplary pipestage 200 of one embodiment. "Speed path" refers to a timing consideration for a circuit that may affect the correct operation or power consumption of the circuit if, for example, one of two signals of interest arrives too late at a given point. While races are frequency independent as described above, speed paths are frequency dependent, i.e. there is typically a lower, or perhaps, even higher, frequency range for which the circuit of interest will work.

The first speed path is referred to as a domino stage 248 trail edge power speed path. The domino stage 248 trail edge power speed path requires that the node 272 should not fall before the input 290 to the domino stage falls to avoid contention, i.e. there is a power contention speed path between the fall of the node 290 at an input to the domino stage 248 and the fall of the node 272 at the gate of the precharge device 274. At very high speed, this speed path behaves like a power pseudo-race. Interlocking, by enabling precharge via the domino stage 265 only after the node 281 rises ensures that at high speed, when the pclk1 and CLK signals have the same phase widths, this pseudo-race has a common point at node 281 and is 3 inversions long on each leg. This power pseudo-race condition can not only be relatively easily met, but can also be violated by at least one inversion of delay without causing a malfunction of the pipestage 200.

The second internal speed path associated with the pipestage 200 is referred to as a domino stage 248 lead edge power speed path. This is an easily-met speed path between the disappearance of the precharge edge (i.e. when the signal at node 272 rises) and the next evaluation at the node 290 in order to avoid contention. There are at least 4 inversions of margin in this path making it relatively safe.

The final internal speed path is referred to herein as a reset domino stage 292 generation speed path. (Domino stage 292 in the phase 2 portion of the pipestage 200 corresponds to the domino stage 265 in the phase 1 portion of the pipestage.) The reset domino stage 292 generation speed path requires that the width of the intersection pulse created by the signal at the node 283 rising and the pclk1 signal falling is sufficient to cause the reset domino stage 292 to evaluate to initiate a reset pulse.

For the exemplary embodiment of FIG. 2, if the input clock signal CLK has a high phase (phase 1) that is two inversions narrower than its low phase (phase 2), then at high speed, the width of the intersection pulse created by node 283 rising and the pclk1 signal falling is nominally only 3 inversions wide as shown by the left plain-shaded area in FIG. 3. This speed path can be easily met by sizing domino stage 292 for simultaneous switching. As the pclk1 signal turns the bottom device 293 on, much earlier than when the signal at node 283 rises, then when the signal at node 283 does rise, it must switch the top device 294 on at high speed.

Stage 292 itself could also be made fast. In addition, inverters 295 and 296 could be sized such that a rising edge transition through them is at least as fast as the domino stages 297 and 298. Further, two very fast inversions could be added in the pclk1 signal path between the output of the clock generator 205 and the gate 293 thus delaying the falling edge of pclk1's intersection with the signal at node 283 without creating much of a negative margin risk for the second speed path discussed above.

The corresponding reset domino stage 265 in the phase 1 portion of the pipestage 200 has a similar speed path except that the clock duty cycle asymmetry assumed here gives it a 7-inversion pulse width for the embodiment shown in FIG. 2. As the input clock signal CLK duty cycle approaches 50%, the two signal intersection pulse widths are equalized to approximately 5 inversions each.

As mentioned above, in some systems, the input clock signal CLK may not have a 50% duty cycle. The pipestage 200 of FIG. 2 is tolerant of appreciable asymmetry in clock phases. For example, an input clock signal CLK may have a rising edge that is delayed by one inversion from its ideal 50% duty cycle position, and a falling edge that is nominally at its 50% ideal position. Assuming a clock cycle that spans 16 inversions for purposes of illustration, nominally, this causes the high phase of the clock (phase 1) to be 7 inversions wide and the low phase (phase 2) to be 9 inversions wide. The complementary clock may be generated by a simple inversion of the CLK signal and has the opposite width relationships.

Such an approach allows pulsed clock signals such as those used in the exemplary pipestage 200 to rise at the 50% duty cycle boundaries. At higher frequencies, however, the falling edges of the pulsed clocks align with those of the input clock signal CLK and cause different margins in the internal speed paths of the two phases. Despite this effect, the exemplary pipestage 200 of one embodiment provides adequate margin for both phases of the CLK signal. In addition, if the input clock signal CLK has a 50% duty cycle, then the margins would be equalized for the two sides improving the phase with the narrower margin.

Further, using the wide-pulsed clock domino design style of one embodiment, time borrowing is also enabled.

Figure 7:
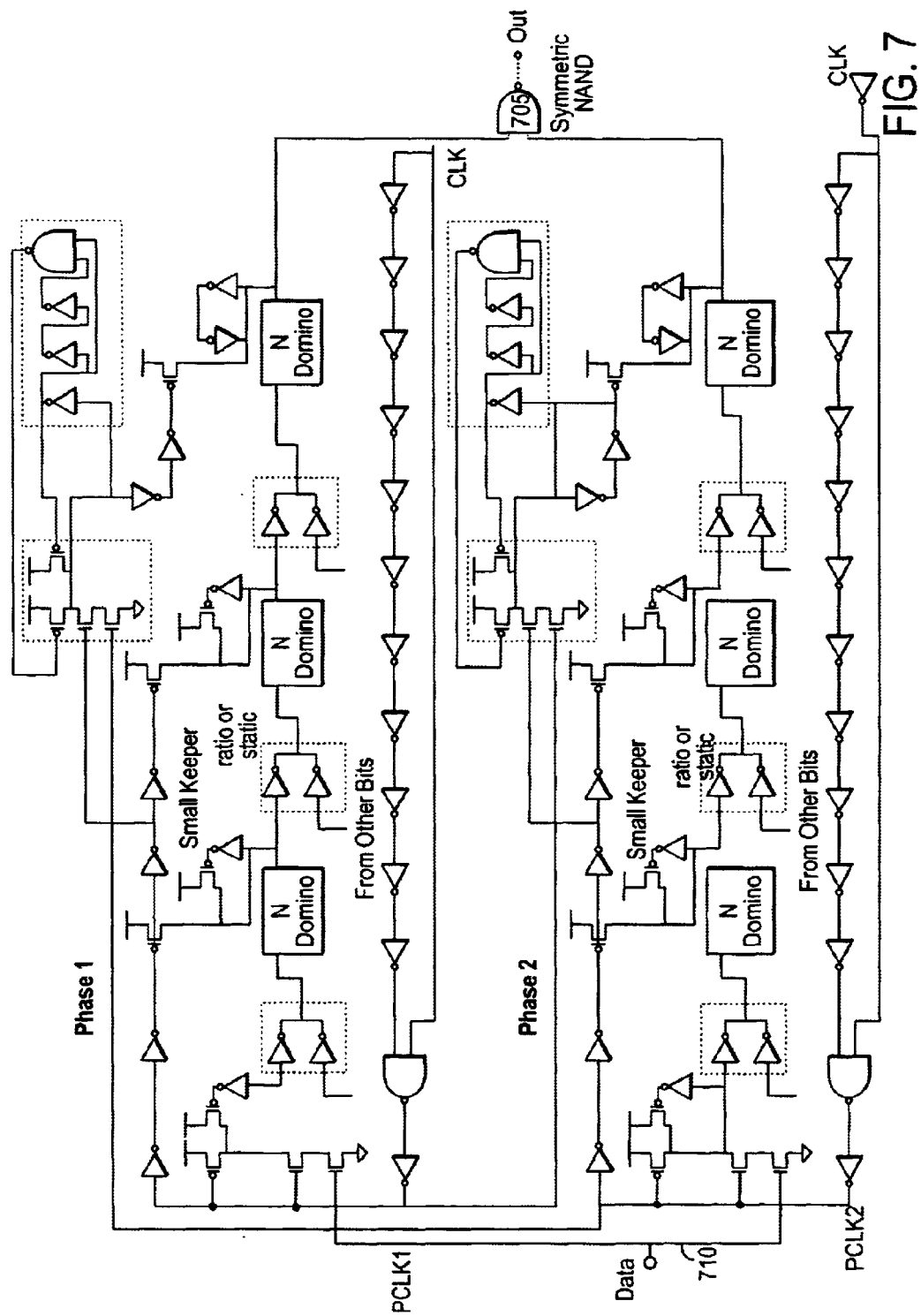
FIG. 7 is a schematic diagram of an exemplary ping-pong pipestage in accordance with the high-speed, state-preserving, race-reducing, wide-pulsed clock domino topology of one embodiment.

The pipestage 200 of FIG. 2 includes a separate inverting output buffer and separate data inputs for each of its phases. Where it is desirable to have a new result from the pipestage for every single phase of an input clock signal CLK, then a ping-pong connection is possible using the approach shown in FIG. 7. This approach uses only one symmetric NAND gate 705 as the final output stage. The inputs to the NAND gate 705 are tied to the outputs of the final logic stages for each of the phase 1 and phase 2 portions of the pipestage 700. The NAND gate 705 essentially performs a P-OR-ing function allowing the ping-pong output to be delivered for every phase of the CLK signal via a single wire to downstream stages (not shown).

A consequence of sharing one output line is that both sides (i.e. phases) of this pipestage should be of substantially equal size in order to drive the matched P devices of the symmetric NAND buffer 705. The data inputs of the two phases may also be tied together on a single incoming wire 710 as shown.

Figure 8:
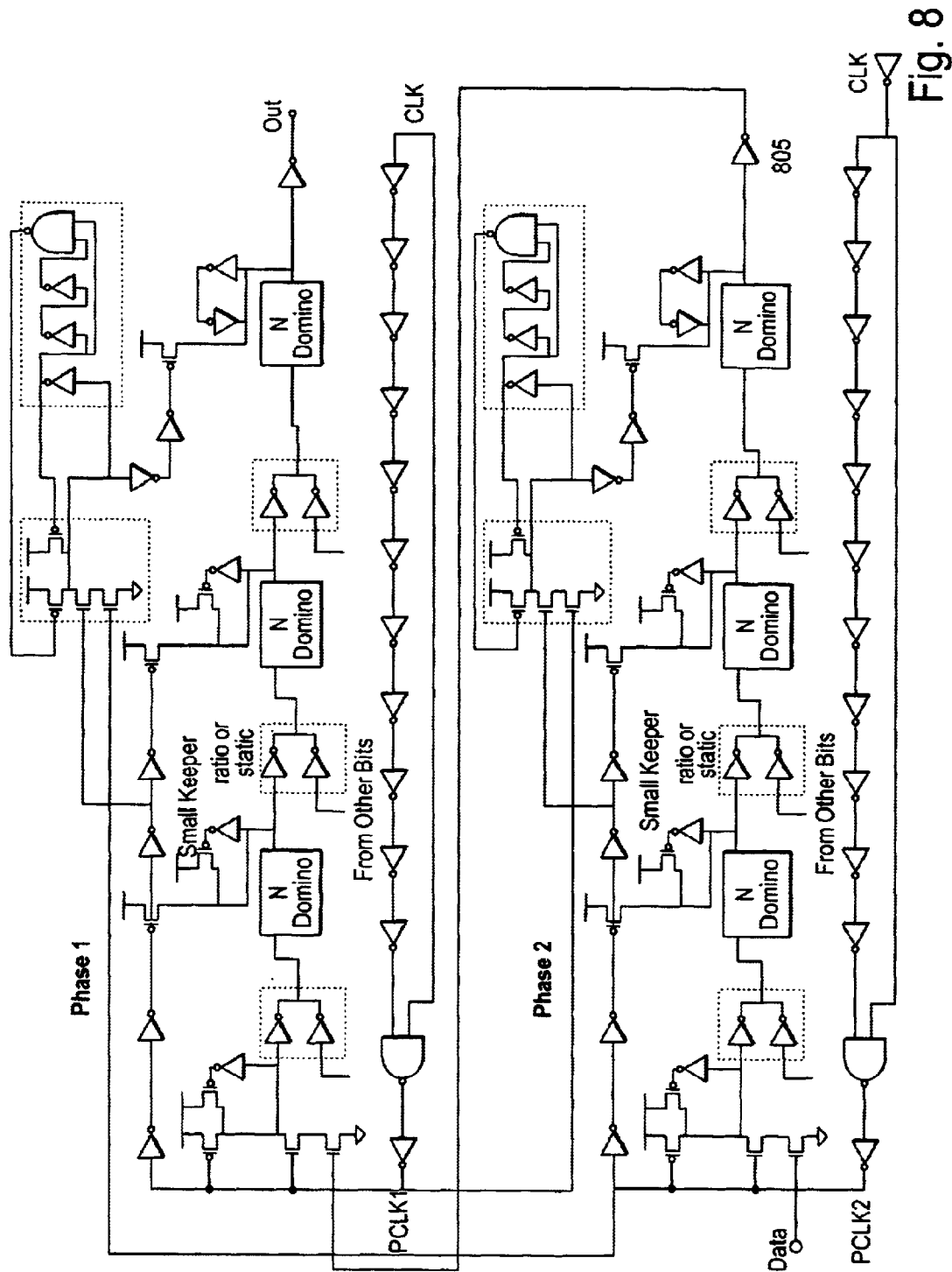
FIG. 8 is a schematic diagram of an exemplary cycle-based pipestage in accordance with the high-speed, state-preserving, race-reducing, wide-pulsed clock domino topology of one embodiment.

It is also possible to develop a cycle-based pipestage using the wide-pulsed design style of one embodiment. Referring to FIG. 8, by making phase 2 of the pipestage 200 of FIG. 2 an input stage and connecting its output to the data input of the phase 1 circuitry, a cycle-based pipestage may be constructed. Further, due to the physical proximity of the two halves of such a cycle-based pipestage, the final stage of phase 2 805 could be used to perform static logic.

Alternatively, by making phase 1 of the pipestage 200 of FIG. 2 the input stage and connecting its output to the data input of the phase 2 circuitry, a cycle-based pipestage may be provided.

Thus, the wide-pulsed clock design style of various embodiments provides an approach for designing high-speed circuits for which race and speed path constraints are relatively easily met as compared to their conventional counterparts. Further, the wide-pulsed design style is flexible to accommodate a relatively wide range of input clock frequencies and duty cycles while maintaining pulse-to-phase width tracking and enabling the use of ratio logic where desired. Use of the wide-pulsed clock design style of various embodiments further provides a pulsed clock that provides pulse-to-phase width tracking of a normal clock input signal over a broad frequency range while providing the capability to design with ratio logic without the risk of indefinite contention.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A circuit comprising:
   one or more domino logic stages;
   a first wide-pulsed clock generator to provide a first wide-pulsed clock signal to control evaluation of the one or more domino logic stages in response to receiving a two-phase input clock signal, the first wide-pulsed clock signal to have a pulse width that tracks a phase width of the input clock signal over a first frequency range, the first frequency range extending at least from a predetermined fraction of a nominal clock frequency to an upper frequency limit for the circuit;
   wherein, the first wide-pulsed clock generator comprises a chopper circuit having a relatively long inverting delay path, and
   wherein the inverting delay path includes a plurality of inverters, the inverters including devices that are sized such that a transition of the input clock signal in a first direction is communicated through the inverting delay path faster than a transition of the input clock signal in an opposite direction.

2. The circuit of claim 1 further comprising
   one or more ratio logic stages coupled to the one or more domino logic stages,
   the first wide-pulsed clock signal to prevent infinite or very long contention in the one or more ratio logic stages when the input clock signal is stopped or slowed to have a frequency below the predetermined fraction.

3. The circuit of claim 1 wherein
   the transition of the input clock signal in the first direction is faster than the transition of the input clock signal in the opposite direction by an amount sufficient to cause pulse evaporation at a first frequency, the first wide-pulsed clock generator to provide width-limited pulses corresponding to the input clock signal for frequencies equal to or above the first frequency.

4. The circuit of claim 1 further comprising:
   a second wide-pulsed clock generator to provide a second wide-pulsed clock signal in response to receiving a complement of the two-phase input clock signal, the second wide-pulsed clock signal to have a pulse width that tracks a phase width of the complement of the input clock signal over a second frequency range, the second frequency range extending at least from a predetermined fraction of a nominal clock frequency to an upper frequency limit for the circuit.

5. The circuit of claim 1 wherein the first wide-pulsed clock generator includes a clock gating device to receive an enable signal, the clock gating device to prevent toggling of downstream devices in response to an input clock signal when the enable signal is de-asserted.

6. The circuit of claim 1 further comprising
   a latch coupled to an output of a final domino stage in the one or more domino stages, and
   reset circuitry to control precharging of the one or more domino stages, the reset circuitry to control precharging of the final domino stage, such that an output of the final domino stage is preserved at the latch.

7. The circuit of claim 6 wherein the reset circuitry comprises
   a self-resetting precharge domino stage and an atomic reset circuit.

8. The circuit of claim 6 wherein the reset circuitry is further to provide a regenerated pulsed clock signal in response to receiving the first wide-pulsed clock signal.

9. The circuit of claim 1 wherein one phase of the two-phase input clock signal is wider than another phase of the two-phase input clock signal.

10. A pipestage comprising:
    a first wide-pulsed clock signal generator to provide a first wide-pulsed clock signal in response to receiving a two-phase input clock signal, the first wide pulsed clock signal to track a phase width of the input clock signal over a frequency range that extends from a first fraction of a nominal frequency for the input clock signal to an upper frequency limit;
    a second wide-pulsed clock signal generator to provide a second wide-pulsed clock signal in response to receiving a complement of the two-phase input clock signal;
    a first set of serially-coupled logic stages, the first set of logic stages including at least one domino logic stage and at least one non-domino logic stage, precharging and evaluation of the first set of logic stages being controlled in response to the first and second wide-pulsed clock signals;
    a second set of serially-coupled logic stages including at least one domino logic stage and at least one non-domino logic stage, evaluation of the first set of serially-coupled logic stages to be initiated in response to the first wide-pulsed clock signal, evaluation of the second set of serially-coupled logic stages to be initiated in response to the second wide-pulsed clock signal; and
    a logic gate to logically combine a first output signal at an output of the first set of logic stages with a second output signal at an output of the second set of logic stages to produce a result on a single wire for each phase of the input clock signal.

11. The pipestage of claim 10 wherein
    at least one non-domino logic stage comprises power contention-susceptible logic and the wide-pulsed clock generator is to prevent infinite or very long contention at the ratio logic stage when the input clock signal is stopped or slowed down significantly.

12. The pipestage of claim 11 wherein the power contention-susceptible logic comprises ratio logic.

13. The pipestage of claim 10 wherein an output of the second set of logic stages is coupled to an input of the first set of logic stages to provide a cycle-based pipestage.

14. The pipestage of claim 10 wherein an output of the first set of logic stages is coupled to an input of the second set of logic stages to provide a cycle-based pipestage.

15. The pipestage of claim 10 wherein at least one of the first and second wide-pulsed clock generators includes a clock-gating logic gate to receive an enable signal, the clock-gating logic gate to prevent downstream logic gates coupled to an output of the clock-gating logic gate from toggling in response to the input clock signal when the enable signal is de-asserted.

16. A circuit comprising:

a first chopper circuit to provide a first wide-pulsed clock signal in response to a two-phase input clock signal, the first wide-pulsed clock signal to provide pulse-to-phase width tracking over a first frequency range that extends from a fraction of a nominal frequency for the input clock signal to an upper frequency limit for the technology used to implement the circuit;

a first set of serially-coupled logic stages including at least one domino logic stage and at least one non-domino logic stage, evaluation of the first set of logic stages to be initiated in response to the first wide-pulsed clock signal;

a second chopper circuit to provide a second wide-pulsed clock signal in response to a complement of the two-phase input signal, the second wide-pulsed clock signal to provide pulse-to-phase width tracking over the first frequency range;

a second set of serially-coupled logic stages including at least one domino logic stage and at least one non-domino logic stage, evaluation of the second set of logic stages to be initiated in response to the second wide-pulsed clock signal; and a logic gate to logically combine an output of the first set of logic stages with an output of the second set of logic stages to provide a result in response to each phase of the input clock signal at an output of the logic gate.

17. The circuit of claim 16 wherein the first chopper circuit includes an inverting delay path to communicate a transition of the input clock signal in one direction faster than a transition of the input clock signal in an opposite direction, and the second chopper circuit includes an inverting delay path to communicate a transition of the complement of the input clock signal in one direction faster than a transition of the input clock signal in an opposite direction.

18. The circuit of claim 16 further comprising first reset circuitry to control precharging of a final domino stage in the first set of logic stages in response to the first and second wide-pulsed clock signals, and second reset circuitry to control precharging of a final domino stage in the second set if logic stages in response to the first and second wide-pulsed clock signals.

19. The circuit of claim 18 wherein the first reset circuitry is further to provide pulse regeneration for the first wide-pulsed clock signal, the second reset circuitry is further to provide pulse regeneration for the second wide-pulsed clock signal, and the first and second reset circuitry are further to limit the pulse width of the regenerated pulse to improve speed path conditions.

20. The circuit of claim 16 wherein at least one non-domino logic stage is a power contention-susceptible logic stage.

21. The circuit of claim 20 wherein the power contention-susceptible logic stage is a ratio logic stage.

22. The circuit of claim 20 wherein at least one of the first and second wide-pulsed clock generators includes a clock gating logic gate to enable clock gating in response to receiving a clock gating enable signal.

23. The circuit of claim 16 wherein an output of the second set of logic stages is coupled to an input of the first set of logic stages to provide a cycle-based pipestage.

24. The circuit of claim 23 wherein an output of the first set of logic stages is coupled to an input of the second set of logic stages to provide a cycle-based pipestage.

* * * * *